(12) United States Patent
Yoon (10) Patent No.: US 9,263,150 B2
(45) Date of Patent: Feb. 16, 2016

(54) ONE-TIME PROGRAMMABLE MEMORY

(71) Applicant: SK hynix Inc., Gyeonggi-do (KR)

(72) Inventor: Hyun-Su Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/486,482

(22) Filed: Sep. 15, 2014

(65) Prior Publication Data

US 2015/0287474 A1   Oct. 8, 2015

(30) Foreign Application Priority Data

Apr. 3, 2014  (KR) .................. 10-2014-0039860

(51) Int. Cl.

| | | |
|---|---|---|
| G11C 17/00 | (2006.01) | |
| G11C 7/00 | (2006.01) | |
| G11C 17/16 | (2006.01) | |
| G11C 17/10 | (2006.01) | |
| G11C 17/06 | (2006.01) | |
| G11C 17/12 | (2006.01) | |
| G11C 5/06 | (2006.01) | |
| G11C 8/08 | (2006.01) | |
| G11C 17/18 | (2006.01) | |
| G11C 29/44 | (2006.01) | |
| G11C 29/02 | (2006.01) | |
| G11C 13/00 | (2006.01) | |
| G11C 17/14 | (2006.01) | |
| G11C 16/26 | (2006.01) | |

(52) U.S. Cl.
CPC .............. *G11C 17/18* (2013.01); *G11C 17/165* (2013.01); *G11C 13/004* (2013.01); *G11C 13/0069* (2013.01); *G11C 16/26* (2013.01); *G11C 17/12* (2013.01); *G11C 17/14* (2013.01); *G11C 17/16* (2013.01); *G11C 29/027* (2013.01)

(58) Field of Classification Search
CPC ........ G11C 17/16; G11C 17/18; G11C 17/14; G11C 17/12; G11C 16/26; G11C 17/165; G11C 29/027; G11C 13/0069; G11C 13/004
USPC ............................................. 365/94, 96, 200
See application file for complete search history.

(56) References Cited

U.S. PATENT DOCUMENTS

| | | | | |
|---|---|---|---|---|
| 2006/0262626 | A1* | 11/2006 | Lin et al. .................... | 365/225.7 |
| 2007/0172054 | A1* | 7/2007 | Munro et al. .................. | 380/28 |
| 2008/0109904 | A1* | 5/2008 | In et al. ......................... | 726/22 |
| 2010/0052826 | A1* | 3/2010 | Callahan et al. ............. | 333/24 R |
| 2013/0294139 | A1* | 11/2013 | Terzioglu et al. ............. | 365/94 |
| 2014/0201607 | A1* | 7/2014 | Ashkenazi .................... | 714/819 |

FOREIGN PATENT DOCUMENTS

KR   1020070074324   7/2007

* cited by examiner

*Primary Examiner* — Ly D Pham
(74) *Attorney, Agent, or Firm* — IP & T Group LLP (57) ABSTRACT

A one-time programmable memory includes a first cell array including a plurality of one-time programmable memory cells, and a second cell array including a plurality of one-time programmable memory cells, wherein the first cell array and the second cell array are programmed separately during a program operation, and read in combination during a read operation.

18 Claims, 5 Drawing Sheets

| | 411 | | | | | 412 | | | | | D0 | | |
|---|---|---|---|---|---|---|---|---|---|---|---|---|---|
| 0 | 0 | 0 | 0 | | 0 | 0 | 0 | 0 | | 0 | 0 | 0 | 0 |
| 0 | 0 | 0 | 0 | | 0 | 0 | 0 | 0 | | 0 | 0 | 0 | 0 |

FIG. 6B

| | 411 | | | | | 412 | | | | | D0 | | |
|---|---|---|---|---|---|---|---|---|---|---|---|---|---|
| 1 | 0 | 1 | 1 | | 0 | 0 | 0 | 0 | | 1 | 0 | 1 | 1 |
| 0 | 1 | 0 | 1 | | 0 | 0 | 0 | 0 | | 0 | 1 | 0 | 1 |

FIG. 6C

| | 411 | | | | | 412 | | | | | D0 | | |
|---|---|---|---|---|---|---|---|---|---|---|---|---|---|
| 1 | 0 | 1 | 1 | | 1 | 0 | 0 | 1 | | 0 | 0 | 1 | 0 |
| 0 | 1 | 0 | 1 | | 0 | 0 | 0 | 0 | | 0 | 1 | 0 | 1 |

ONE-TIME PROGRAMMABLE MEMORY

CROSS-REFERENCE TO RELATED APPLICATIONS

The present application claims priority of Korean Patent Application No. 10-2014-0039860, filed on Apr. 3, 2014, which is incorporated herein by reference in its entirety.

BACKGROUND

1. Field

Various embodiments of the present invention relate to a one-time programmable memory and, more particularly, to a technology for restoring data that is erroneously written in a one-time programmable memory, to an original state.

2. Description of the Related Art

Programming a laser fuse is accomplished by cutting the laser fuse with a laser. Generally, this means that laser fuses are programmable only in a wafer state and are unable to be programmed after the wafer is packaged.

An electrical fuse (hereinafter, referred to as an e-fuse) is used to overcome the limitations of the laser fuse. E-fuses use transistors that store data by changing the resistance between the gate and the drain/source thereof.

Figure 1:
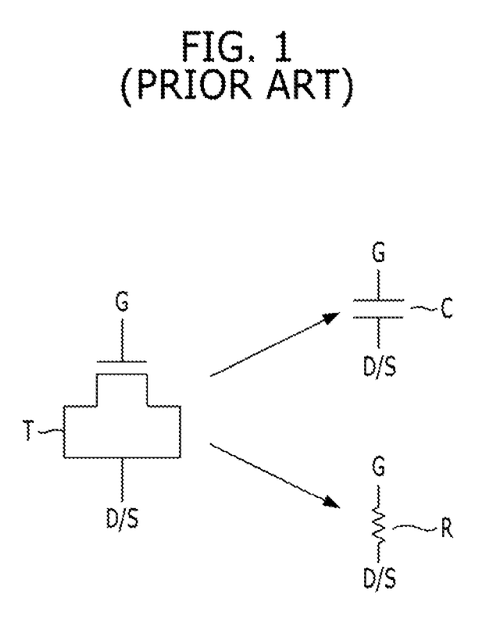
FIG. 1 is a diagram illustrating an e-fuse formed of a transistor operating as a resistor or a capacitor.

FIG. 1 is a diagram illustrating an e-fuse formed of a transistor operating as a resistor or a capacitor.

Referring to FIG. 1, the e-fuse includes a transistor T having a gate G and a drain/source D/S to which a ground voltage is applied.

When a power source voltage, which is tolerable to the transistor T, is applied to the gate G, the e-fuse operates as a capacitor C. Thus, there is no current flowing between the gate G and the drain/source D/S. However, when a high voltage, which is intolerable to the transistor T, is applied to the gate G, a gate oxide of the transistor T is broken down to short the gate G and the drain/source D/S, and thus the e-fuse operates as a resistor R. Accordingly, current flows between the gate G and the drain/source D/S of the e-fuse. The data of the e-fuse is recognized from the resistance value between the gate G and the drain/source D/S. To recognize the data of the e-fuse, two methods are used. First, the data of the e-fuse may be recognized directly without performing an additional sensing operation by increasing the size of the transistor T. Second, the data of the e-fuse may be recognized by sensing a current flowing through the transistor T using an amplifier. However, these two methods are disadvantageous in terms of circuit area because the transistor T of the e-fuse is designed to be large in size or an additional amplifier needs to be provided for each e-fuse.

As disclosed in U.S. Pat. No. 7,269,047, research is being carried out on a method for reducing the circuit area occupied by e-fuses.

Figure 2:
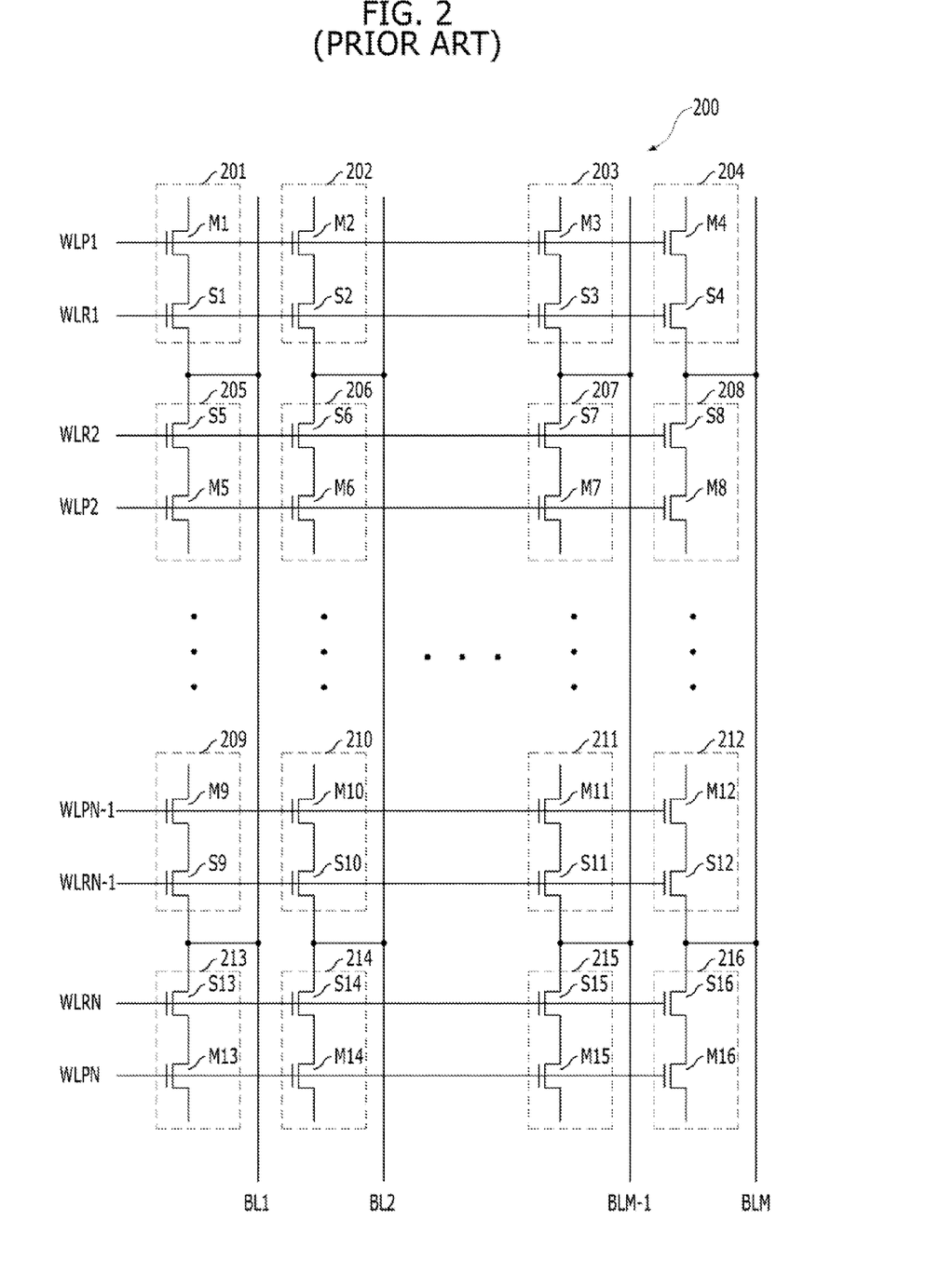
FIG. 2 is a diagram illustrating a cell array including e-fuses.

FIG. 2 is a diagram illustrating a cell array 200 including e-fuses.

Referring to FIG. 2, the cell array 200 includes one-time programmable memory cells 201 to 216 arranged in N rows and M columns. The memory cells 201 to 216 include memory elements M1 to M16 and switching elements S1 to S16, respectively. For example, a memory cell 201 includes a memory element M1 and a switching element S1. The memory elements M1 to M16 are e-fuses having characteristics of a resistor or a capacitor based on whether they are ruptured. In other words, the e-fuses M1 to M16 may be regarded as resistive memory elements that store data according to the amount of resistance. The switching elements S1 to S16 electrically connect the memory elements M1 to M16 to column lines BL1 to BLM, respectively, under the control of row lines WLR1 to WLRN.

Hereafter, it is assumed that a second row and an Mt column are selected. In other words, it is assumed that a memory cell 208 is selected. Voltages applied to the selected memory cell 208 and unselected memory cells 201 to 207 and 209 to 216 during a program and read operation are described below.

Program Operation

The row line WLR2 of the selected row is activated and the other row lines WLR1 and WLR3 to WLRN are deactivated. Thus, the switching elements S5 to S8 are turned on, and the switching elements S1 to S4 and S9 to S16 are turned off. A high voltage that may break a gate oxide of the e-fuse, which is generally obtained by a charge pumping method using a power source voltage, is applied to a program/read line WLP2 of the selected row, and a low level voltage, e.g., a ground voltage, is applied to the other program/read lines WLP1 and WLP3 to WLPN. The selected column line BLM is coupled with a data access circuit (not shown), and the unselected column lines BLM1 to BLM-1 float. When inputted data is program data (e.g., '1'), the data access circuit drives the selected column line BLM to a logic low level and allows the memory element M8 of the selected memory cell 208 to be programmed (or ruptured). When the inputted data is not program data (e.g., '0'), the data access circuit drives the selected column line BLM to a logic high level and substantially prevents the memory element M8 of the selected memory cell 208 from being programmed. Since the unselected column lines BLM1 to BLM-1 float, the memory elements M5 to M7 are not programmed even though a high voltage is applied to the gates thereof.

Read Operation

The row line WLR2 of the selected row is activated and the other row lines WLR1 and WLR3 to WLRN are deactivated. Thus, the switching elements S5 to S8 are turned on, and the switching elements S1 to S4 and S9 to S16 are turned off. A voltage, which is appropriate for the read operation, e.g., a power source voltage, is applied to the program/read line WLP2 of the selected row, and a low level voltage, e.g., a ground voltage, is applied to the other program/read lines WLP1 and WLP3 to WLPN. The selected column line BLM is coupled with the data access circuit and the unselected column lines BLM1 to BLM-1 float. When current flows through the selected column line BLM, the data access circuit recognizes that the program element M8 is programmed. In other words, the data access circuit may recognize that the data of the memory cell 208 is '1'. When no current flows through the selected column line BLM, the data access circuit recognizes that the program element M8 is not programmed. In other words, the data access circuit may recognize that the data of the memory cell 208 is '0'.

Although it is illustrated herein that one column line BLM is selected among the column lines BL1 to BLM, several column lines may be selected at once. In other words, several memory cells belonging to one row may be simultaneously programmed or read.

Figure 3:
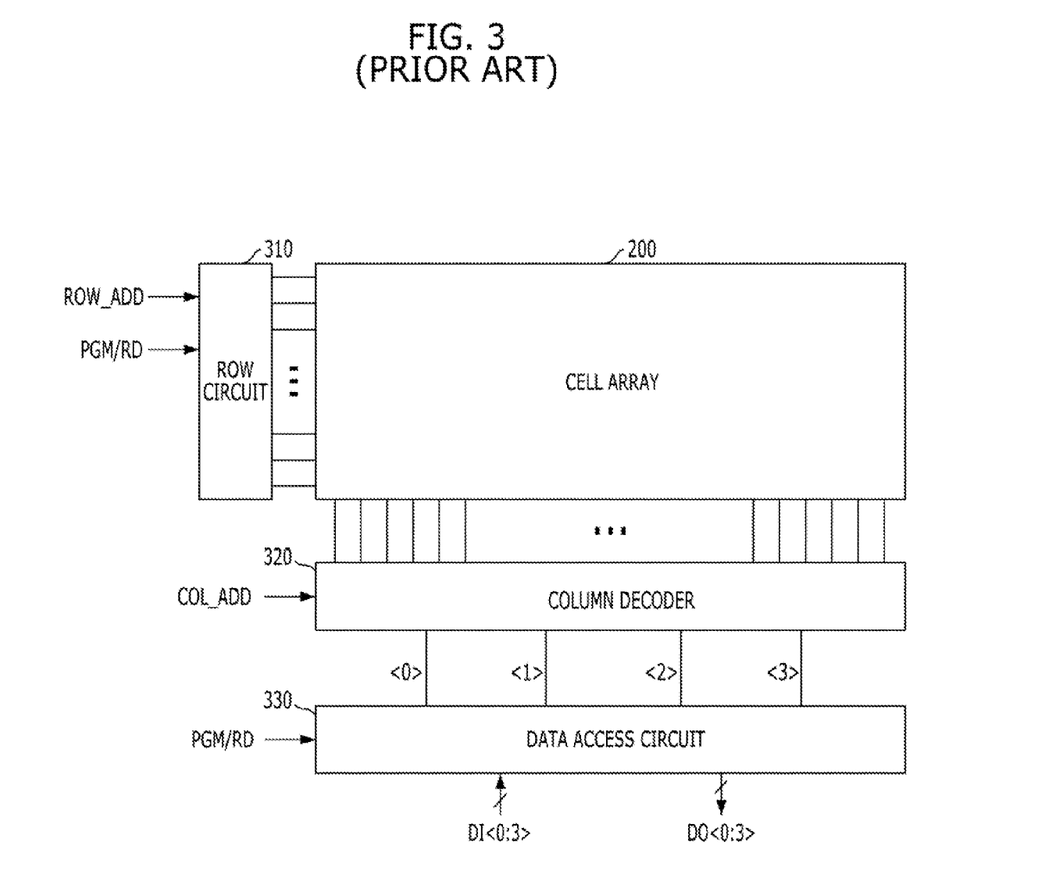
FIG. 3 is a block diagram illustrating an e-fuse array circuit including the cell array shown in FIG. 2.

FIG. 3 is a block diagram illustrating an e-fuse array circuit including the cell array 200 shown in FIG. 2.

Referring to FIG. 3, the e-fuse array circuit includes the cell array 200 shown in FIG. 2, a row circuit 310, a column decoder 320, and a data access circuit 330.

The row circuit 310 controls the row lines WLR1 to WLRN and the program/read lines WLP1 to WLPN and allows the program operation or the read operation to be performed as described above. A row address ROW_ADD inputted to the row circuit 310 designates a row selected from a plurality of rows, and a program/read signal PGM/RD inputted to the row circuit 310 directs the program operation or the read operation.

The column decoder 320 electrically connects a column line, which is selected from the column lines BL1 to BLM based on a column address COL_ADD, to the data access circuit 330. Hereafter, it is assumed that four column lines are simultaneous selected from the column lines BL1 to BLM.

The data access circuit 330 performs data access operations on the column lines selected by the column decoder 320. The data access circuit 330 controls the selected column line to be programmed/non-programmed based on input data DI<0:3> during the program operation. The data access circuit 330 detects whether current flows through the selected column lines and outputs the detected result as output data DO<0:4> during the read operation.

In a memory such as an e-fuse array circuit, when data is programmed once, the memory may not return to its previous state. In other words, the memory cells of an e-fuse array cannot generally be programmed again. Thus, a memory such as an e-fuse array circuit, in which data is programmable only once, is referred to as a one-time programmable memory. Therefore, a technology that may restore data, which is erroneously programmed in a one-time programmable memory, to an original state is in demand.

SUMMARY

Various embodiments of the present invention are directed to a technology for restoring data that is erroneously programmed in a one-time programmable memory to an original state.

In accordance with an embodiment of the present invention, a one-time programmable memory includes: a first cell array including a plurality of one-time programmable memory cells; and a second cell array including a plurality of one-time programmable memory cells, wherein the first cell array and the second cell array are programmed separately during a program operation, and read in combination (meaning one data bit results from the comparison of two data bits) during a read operation.

In accordance with an embodiment of the present invention, a one-time programmable memory includes: a first cell array including one-time programmable memory cells arranged in a plurality of rows and a plurality of columns; a second cell array including one-time programmable memory cells arranged in a plurality of rows and a plurality of columns; a row circuit suitable for controlling a row selected based on a row address among the rows of the first cell array to perform a read operation and controlling a row selected based on the row address among the rows of the second cell array to perform a read operation during the read operation; and a column circuit suitable for reading data from a column selected based on a column address among the columns of the first cell array and reading data from a column selected based on the column address among the columns of the second cell array during the read operation, and generating output data by comparing the data read in the first cell array with the data read in the second cell array.

In accordance with an embodiment of the present invention, a one-time programmable memory includes: a cell array including a plurality of one-time programmable memory cells; and a complementary cell array including a plurality of one-time programmable memory cells, wherein a program operation on the complementary cell array is performed when data is erroneously programmed in a one-time programmable memory cell of the cell array.

DETAILED DESCRIPTION

Exemplary embodiments of the present invention are described below in more detail with reference to the accompanying drawings. These embodiments are provided so that this disclosure is thorough, complete, and fully conveys the scope of the present invention to those skilled in the art. Throughout the disclosure, like reference numerals refer to like parts in the various figures and embodiments of the present invention.

In the drawings, thicknesses and lengths of components are exaggerated compared to actual physical thickness and lengths for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form, and vice versa, as long as it is not specifically mentioned in a sentence. Furthermore, 'include/comprise' or 'including/comprising' used in the specification represents that one or more components, steps, operations, and elements exist or are added.

Figure 4:
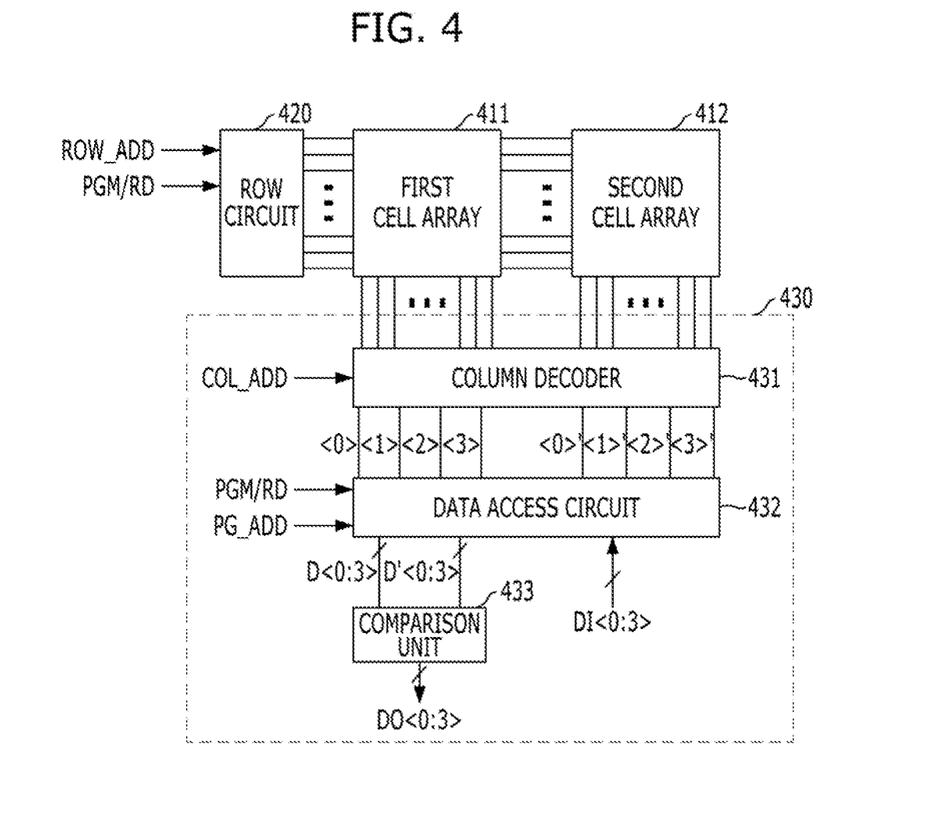
FIG. 4 is a block diagram illustrating a one-time programmable memory in accordance with an embodiment of the present invention.

FIG. 4 is a block diagram illustrating a one-time programmable memory in accordance with an embodiment of the present invention.

Referring to FIG. 4, the one-time programmable memory may include a first cell array 411, a second cell array 412, a row circuit 420, and a column circuit 430.

The first cell array 411 may include one-time programmable memory cells arranged in a plurality of rows, e.g., N rows, and a plurality of columns, e.g., M columns. The structure of the first cell array 411 may be the same as that of the cell array 200 shown in FIG. 2. The structure of the second cell array 412 may be the same as that of the cell array 200 shown in FIG. 2 as well. The first cell array 411 and the second cell array 412 may include the same number of rows and columns and share row control lines (i.e., the row lines WLR1 to WLRN and the program/read lines WLP1 to WLPN). The second cell array 412 may be referred to as a complementary cell array of the first cell array 411.

During a program operation, i.e., a write operation, the first cell array 411 and the second cell array 412 may operate independently, and during a read operation, the first cell array 411 and the second cell array 412 may operate simultaneously. In other words, a memory cell in an $A^{th}$ row (where 'A' is an integer ranging from 1 to N) and $B^{th}$ column (where B is an integer ranging from 1 to M) of the first cell array 411 and a memory cell in an $A^{th}$ row and $B^{th}$ column of the second cell array 412 may be programmed separately, and a read operation may be performed on the memory cell in the $A^{th}$ row and $B^{th}$ column of the second cell array 412 simultaneously while a read operation is performed on the memory cell in the $A^{th}$ row and $B^{th}$ column of the first cell array 411. An address that designates the memory cell in the $A^{th}$ row and $B^{th}$ column of the first cell array 411 and an address that designates the memory cell in the $A^{th}$ row and $B^{th}$ column of the second cell array 412 are the same during the read operation. However, an address that designates the memory cell in the $A^{th}$ row and $B^{th}$ column of the first cell array 411 may be different from an address that designates the memory cell in the $A^{th}$ row and $B^{th}$ column of the second cell array 412 during the program operation. The data read from the first cell array 411 and the data read from the second cell array 412 during the read operation are compared (or combined) to each other, and output data DO<0:3> of the one-time programmable memory may be generated based on the compared (or combined) result.

The row circuit 420 may control the row control lines (i.e., the row lines WLR1 to WLRN and the program/read lines WLP1 to WLPN) so that the row selected based on a row address ROW_ADD performs the read operation. The row circuit 420 applies a voltage that may turn on a switching element to the row line of the selected row and apply a voltage that may break a gate oxide of an e-fuse (i.e., a transistor) to a program/read line of the selected row during the program operation. The row circuit 420 may apply a voltage of a low level, e.g., a ground voltage, to a row line and a program/read line of the unselected row during the program operation. The row circuit 420 may apply a voltage that may turn on a switching element to the row line of the selected row and apply a voltage, which is appropriate for the read operation, e.g., a power source voltage, to a program/read line of the selected row during the read operation. The row circuit 420 may apply a voltage of a low level, e.g., a ground voltage, to a row line and a program/read line of the unselected row during the read operation.

Since the first cell array 411 and the second cell array 412 share the row control lines (i.e., the row lines WLR1 to WLRN and the program/read lines WLP1 to WLPN), a row control operation of the row circuit 420 may be simultaneously performed on the first cell array 411 and the second cell array 412. For example, when a $32^{nd}$ row is selected to perform the program operation in the first cell array 411 by the row circuit 420, a $32^{nd}$ row is also selected to perform the program operation in the second cell array 412. When a $24^{th}$ row is selected to perform the read operation in the first cell array 411 by the row circuit 420, a $24^{th}$ row is also selected to perform the read operation in the second cell array 412.

The column circuit 430 reads data from a column selected based on a column address COL_ADD among the columns of the first cell array 411 and reads data from a column selected based on the column address COL_ADD among the columns of the second cell array 412 during the read operation. The column circuit 430 may generate the output data DO<0:3> in comparison with data D<0:3> read from the first cell array 411 and data D<0:3> read from the second cell array 412. Also, the column circuit 430 may control inputted program data DI<0:3> to be written in the column selected based on the column address COL_ADD and a program address PG_ADD among the columns of the first cell array 411 and the second cell array 412 during the program operation.

The column circuit 430 may include a column decoder 431, a data access circuit 432, and a comparison unit (or combination unit) 433.

The column decoder 431 may select one or more columns in response to the column address COL_ADD among the columns of the first cell array 431 and select one or more columns in response to the column address COL_ADD among the columns of the second cell array 432. Herein, it is assumed that the column decoder 431 selects four columns among the columns of the first cell array 411 and selects four columns among the columns of the second cell array 412. Since the columns of the first cell array 411 and the columns of the second cell array 412 are selected based on the same column address COL_ADD, the same columns may be selected in the first cell array 411 and the second cell array 412. For example, when $5^{th}$ to $8^{th}$ columns are selected in the first cell array 411, $5^{th}$ to $8^{th}$ columns are also selected in the second cell array 412. The four columns selected in the first cell array 411 by the column decoder 431 may be coupled with lines <0> to <3>, and the four columns selected in the second cell array 412 by the column decoder 431 may be coupled with lines <0>' to <3>'.

Based on the control of voltage levels of the selected columns, the data access circuit 432 may control the program data DI<0:3> to be written in the columns selected based on the program address PG_ADD among the columns selected from the first cell array 411, and the columns selected from the second cell array 412 during the program operation. For example, when the columns of the first cell array, which are coupled with the lines <0> to <3>, are selected based on the program address PG_ADD, the program data may be written in the columns, which are coupled with the lines <0> to <3>, and the columns coupled with the lines <0>' to <3>' float. In other words, the data access circuit 432 may selectively write the program data DI<0:3> in the first cell array 411 or the second cell array 412 based on the program address PG_ADD.

The data access circuit 432 may not use the program address PG_ADD during the read operation. The data access circuit 432 may output the data D<0:3> by reading the data from the columns selected from the first cell array 411, which are coupled with the lines <0> to <3>, and output the data D'<0:3> by reading the data from the columns selected from the second cell array 412, which are coupled with the lines <0>' to <3>' during the read operation. The data may be read by detecting whether or not current flows through the selected columns.

The comparison unit 433 may generate the output data DO<0:3> in comparison with the data D<0:3> read from the first cell array 411 and the data D'<0:3> read from the second cell array 412 by the data access circuit 432 during the read operation. The comparison unit 433 may generate different logic values of the output data DO<0:3> based on whether the data D<0:3> read from the first cell array 411 and the data D'<0:3> read from the second cell array 412 is the same.

Figure 5:
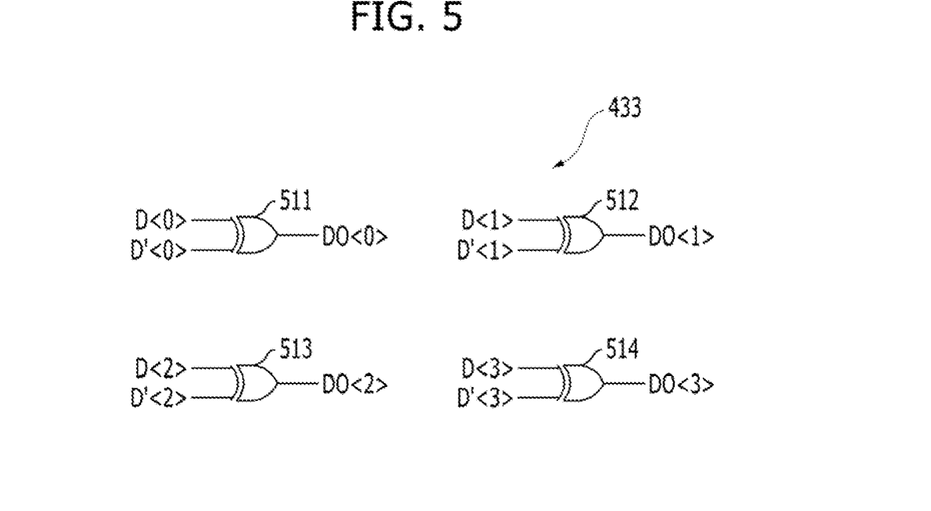
FIG. 5 is a detailed diagram of a comparison unit shown in FIG. 4.

FIG. 5 is a detailed diagram of the comparison unit 433 shown in FIG. 4.

Referring to FIG. 5, the comparison unit 433 may include XOR gates 511 to 514 for comparing the data D<0:3> read from the first cell array 411 with the data D'<0:3> read from the second cell array 412. The comparison unit 433 may generate the output data DO<0:3> as a logic value '0' when the data D<0:3> and the data D'<0:3> are the same, and generate the output data DO<0:3> as a logic value '1' when the data D<0:3> and the data D'<0:3> are different from each other.

Table 1 is a truth table showing the output data DO<0>. The other output data DO<1:3> may be generated in the same manner as the output data DO<0>.

TABLE 1

| D<0> | D'<0> | DO<0> |
|---|---|---|
| 0 | 0 | 0 |
| 0 | 1 | 1 |
| 1 | 0 | 1 |
| 1 | 1 | 0 |

Figure 6A:
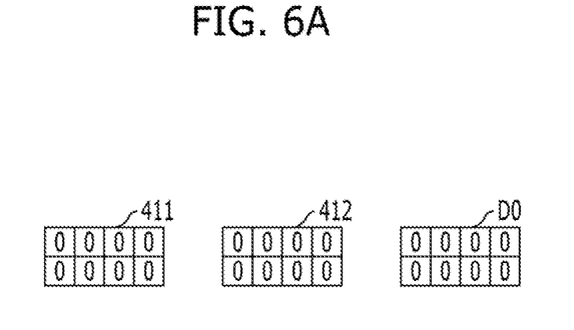
FIGS. 6A to 6C are diagrams for describing processes in which data is programmed in the one-time programmable memory shown in FIG. 4 and the data erroneously programmed is restored to an original state.
Figure 6B:
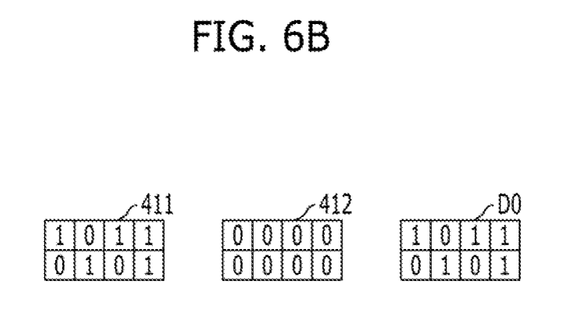
Figure 6C:
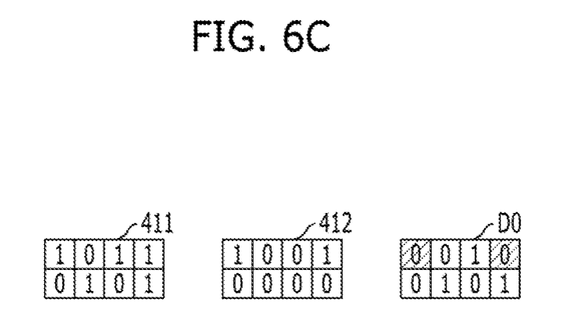

FIGS. 6A to 6C are diagrams for describing processes in which data is programmed in the one-time programmable memory shown in FIG. 4 and the data erroneously programmed is restored to an original state. For the sake of convenience in description, it is assumed that the first cell array 411 and the second cell array 412 include memory cells arranged in 2 rows and 4 columns.

Referring to FIG. 6A, a logic value '0' is written in all the memory cells of the first and second cell arrays 411 and 412 in a state where no data is programmed. When the read operation is performed in this state, all the output data DO is generated with a logic value '0'.

Referring to FIG. 6B, data to be written in the one-time programmable memory is programmed in the first cell array 411. No data is programmed in the second cell array 412. When the read operation is performed in this state, the output data DO is generated identically with the data written in the first cell array 411.

When, in a state of writing the data as shown in FIG. 6B, data in a first row and a first column and data in the first row and a fourth column of the first cell array 411 are to be restored to an original state, a first row and a first column, and the first row and a fourth column of the second cell array 412 are programmed as a logic value '1' as shown in FIG. 6C. When the read operation is performed while the data is programmed as shown in FIG. 6C, the data erroneously written may be generated as the output data DO restored to an original state. As represented by deviant crease lines in FIG. 6C, the output data DO corresponding to the data in a first row and a first column and the data in a first row and a fourth column of the first cell array 411 is restored to an original state (e.g., '0').

Although FIGS. 6A to 6C illustrate the first cell array 411 as a cell array for writing the data and the second cell array 412 as a cell array for restoring the data erroneously written in the first cell array to an original state, those may be switched with each other.

As described above, it may be possible to restore the data erroneously programmed in the one-time programmable memory to an original state since the first cell array 411 and the second cell array 412 may be programmed separately, and the read operation is simultaneously performed on the first cell array 411 and the second cell array 412, and the output data DO is generated by comparing (or combining) the data of the first cell array 411 with the data of the second cell array 412.

In accordance with the embodiments of the present invention, data erroneously written in a one-time programmable memory may be restored to an original state.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

What is claimed is:

1. A one-time programmable memory, comprising:
   a first cell array including a plurality of one-time programmable memory cells; and
   a second cell array including a plurality of one-time programmable memory cells,
   wherein the first cell array and the second cell array are programmed separately during a program operation, and read in combination during a read operation, and
   row control lines of the first cell array and the second cell array are shared with each other.

2. The one-time programmable memory of claim 1, wherein the first cell array and the second cell array are simultaneously read and output data is determined by combining data of the first and second cell arrays with each other during a read operation.

3. The one-time programmable memory of claim 2, wherein the first cell array and the second cell array include the same number of rows and the same number of columns.

4. The one-time programmable memory of claim 3, wherein two data are read from one-time programmable memory cells in the same row and the same column of the first and second cell arrays during the read operation, and a logic value of the output data is determined based on whether the data read in the first cell array and the data read in the second cell array is the same.

5. The one-time programmable memory of claim 2, wherein the first cell array is used for storing data, and the second cell array is used for restoring the data of the first cell array to an original state.

6. The one-time programmable memory of claim 2, wherein each of the one-time programmable memory cells of the first cell array and the second cell array includes an e-fuse.

7. A one-time programmable memory, comprising:
   a first cell array including one-time programmable memory cells arranged in a plurality of rows and a plurality of columns;
   a second cell array including one-time programmable memory cells arranged in a plurality of rows and a plurality of columns;
   a row circuit suitable for controlling, during a read operation, a row selected based on a row address among the rows of the first cell array to perform a first read operation and controlling a row selected based on the row address among the rows of the second cell array to perform a second read operation during the read operation, wherein the first read operation and the second read operation are subparts of the read operation; and
   a column circuit suitable for reading data from a column selected based on a column address among the columns of the first cell array and reading data from a column selected based on the column address among the columns of the second cell array during the read operation, and generating output data by comparing the data read in the first cell array with the data read in the second cell array,
   wherein row control lines of the first cell array and the second cell array are shared with each other.

8. The one-time programmable memory of claim 7, wherein the row circuit controls the row selected based on the row address among the rows of the first cell array to perform a program operation and controls the row selected based on the row address among the rows of the second cell array to perform a program operation, and the column circuit controls the selected columns to write program data in the columns selected based on the column address and a program address among the columns of the first cell array and the columns of the second cell array during the program operation.

9. The one-time programmable memory of claim 7, wherein the first cell array and the second cell array include the same number of rows and the same number of columns.

10. The one-time programmable memory of claim 7, wherein the first cell array is used for storing data, and the second cell array is used for restoring the data of the first cell array to an original state.

11. The one-time programmable memory of claim 7, wherein each of the one-time programmable memory cells of the first cell array and the second cell array includes an e-fuse.

12. A one-time programmable memory, comprising:
a first cell array including one-time programmable memory cells arranged in a plurality of rows and a plurality of columns;
a second cell array including one-time programmable memory cells arranged in a plurality of rows and a plurality of columns;
a row circuit suitable for controlling, during a read operation, a row selected based on a row address among the rows of the first cell array to perform a first read operation and controlling a row selected based on the row address among the rows of the second cell array to perform a second read operation during the read operation, wherein the first read operation and the second read operation are subparts of the read operation; and
a column circuit suitable for reading data from a column selected based on a column address among the columns of the first cell array and reading data from a column selected based on the column address among the columns of the second cell array during the read operation, and generating output data by comparing the data read in the first cell array with the data read in the second cell array,
wherein the row circuit controls the row selected based on the row address among the rows of the first cell array to perform a program operation and controls the row selected based on the row address among the rows of the second cell array to perform a program operation,
the column circuit controls the selected columns to write program data in the columns selected based on the column address and a program address among the columns of the first cell array and the columns of the second cell array during the program operation, and
wherein the column circuit includes:
a column decoder suitable for selecting a column corresponding to the column address among the columns of the first cell array and selecting a column corresponding to the column address among the columns of the second cell array;
a data access circuit suitable for reading data from the column of the first cell array selected by the column decoder and reading data from the column of the second cell array selected by the column decoder during the read operation, and controlling the program data to be programmed in the column of the first cell array selected by the column decoder and the column selected based on the program address among the columns of the second cell array selected by the column decoder during a program operation; and
a comparator suitable for generating the output data by comparing the data read from the column of the first cell array with the data read from the column of the second cell array by the data access circuit during the read operation.

13. The one-time programmable memory of claim 12, wherein the comparator determines a logic value of the output data based on whether two data to be compared are the same.

14. A one-time programmable memory, comprising:
a cell array including a plurality of one-time programmable memory cells; and
a complementary cell array including a plurality of one-time programmable memory cells,
wherein a program operation on the complementary cell array is performed when data is erroneously programmed in a one-time programmable memory cell of the cell array, and
rows of the cell array and the complementary cell array are shared with each other.

15. The one-time programmable memory of claim 14, further comprising a row circuit suitable for selecting a row to be programmed or read based on a program/read signal and a row address.

16. The one-time programmable memory of claim 14, further comprising a column circuit suitable for reading data from a column selected based on a column address among the columns of the cell array and reading data from a column selected based on the column address among the columns of the complementary cell array during a read operation, and generating output data by combining the data read in the cell array with the data read in the complementary cell array.

17. The one-time programmable memory of claim 14, wherein the column circuit includes XOR gates each receiving the data read from the column of the cell array and the data read from the column of the complementary cell array during a read operation.

18. The one-time programmable memory of claim 14, wherein each of the one-time programmable memory cells of the cell array and the complementary cell array includes an e-fuse.

* * * * *